(12) United States Patent
Cheng et al.

(10) Patent No.: US 8,806,386 B2
(45) Date of Patent: Aug. 12, 2014

(54) CUSTOMIZED PATTERNING MODULATION AND OPTIMIZATION

(75) Inventors: Ying-Chou Cheng, Zhubei (TW); Ru-Gun Liu, Hsinchu (TW); Josh J. H. Feng, Lotung (TW); Tsong-Hua Ou, Taipei (TW); Luke Lo, Pingjhen (TW); Chih-Ming Lai, Hsinchu (TW); Wen-Chun Huang, Tainan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 736 days.

(21) Appl. No.: 12/625,749

(22) Filed: Nov. 25, 2009

(65) Prior Publication Data

US 2011/0124193 A1    May 26, 2011

(51) Int. Cl.
*G06F 17/50*    (2006.01)

(52) U.S. Cl.
USPC .................................. 716/50; 716/51; 716/54

(58) Field of Classification Search
None
See application file for complete search history.

(56) References Cited

U.S. PATENT DOCUMENTS

| | | | |
|---|---|---|---|
| 5,048,800 A | 9/1991 | Miyazaki et al. | |
| 5,440,478 A | 8/1995 | Fisher et al. | |
| 5,847,965 A | 12/1998 | Cheng | |
| 5,963,881 A | 10/1999 | Kahn et al. | |
| 6,028,991 A | 2/2000 | Akashi | |
| 6,045,619 A | 4/2000 | Tai et al. | |
| 6,077,310 A | 6/2000 | Yamamoto et al. | |
| 6,289,257 B1 | 9/2001 | Sekine | |
| 6,408,219 B2 | 6/2002 | Lamey, Jr. et al. | |
| 6,410,351 B1 | 6/2002 | Bode et al. | |
| 6,549,864 B1 | 4/2003 | Potyrailo | |
| 6,810,296 B2 | 10/2004 | Bode et al. | |
| 6,917,849 B1 | 7/2005 | Pasadyn et al. | |
| 6,968,253 B2 | 11/2005 | Mack et al. | |
| 6,980,873 B2 | 12/2005 | Shen | |
| 7,144,297 B2 | 12/2006 | Lin et al. | |
| 7,155,689 B2 * | 12/2006 | Pierrat et al. | 716/52 |
| 7,174,520 B2 * | 2/2007 | White et al. | 716/136 |
| 7,207,017 B1 * | 4/2007 | Tabery et al. | 716/52 |
| 7,266,800 B2 * | 9/2007 | Sezginer | 716/52 |
| 7,353,475 B2 * | 4/2008 | White et al. | 716/52 |
| 7,360,191 B2 | 4/2008 | Chang et al. | |
| 7,363,207 B2 | 4/2008 | Kamon | |
| 7,367,008 B2 * | 4/2008 | White et al. | 716/52 |
| 7,380,220 B2 * | 5/2008 | Smith et al. | 716/111 |
| 7,712,056 B2 * | 5/2010 | White et al. | 716/136 |
| 7,774,726 B2 * | 8/2010 | White | 716/51 |
| 7,783,999 B2 | 8/2010 | Ou et al. | |
| 8,001,494 B2 * | 8/2011 | Hou et al. | 716/54 |
| 8,037,575 B2 | 10/2011 | Cheng et al. | |

(Continued)

OTHER PUBLICATIONS

Tian, Yuxin, et al., "Impact of Photolithography and Mask Variability on Interconnect Parasitics," 10 pages.

(Continued)

*Primary Examiner* — A. M. Thompson
(74) *Attorney, Agent, or Firm* — Haynes and Boone, LLP (57) ABSTRACT

The present disclosure provides one embodiment of an integrated circuit (IC) design method. The method includes providing an IC design layout of a circuit; applying an electrical patterning (ePatterning) modification to the IC design layout according to an electrical parameter of the circuit and an optical parameter of IC design layout; and thereafter fabricating a mask according to the IC design layout.

22 Claims, 5 Drawing Sheets

(56) References Cited

U.S. PATENT DOCUMENTS

| | | |
|---|---|---|
| 2004/0029299 A1 | 2/2004 | Pasadyn et al. |
| 2004/0040001 A1 | 2/2004 | Miller et al. |
| 2004/0093107 A1 | 5/2004 | Good et al. |
| 2004/0181299 A1 | 9/2004 | Yamazaki et al. |
| 2005/0007577 A1 | 1/2005 | Engelhard et al. |
| 2005/0008227 A1 | 1/2005 | Duan et al. |
| 2005/0021272 A1 | 1/2005 | Jenkins et al. |
| 2005/0044514 A1 | 2/2005 | Wu et al. |
| 2005/0120328 A1 | 6/2005 | Seltmann et al. |
| 2005/0132306 A1 | 6/2005 | Smith et al. |
| 2005/0188338 A1 | 8/2005 | Kroyan et al. |
| 2005/0209820 A1 | 9/2005 | Inoue et al. |
| 2005/0288812 A1 | 12/2005 | Cheng et al. |
| 2006/0026539 A1 | 2/2006 | Tetelbaum et al. |
| 2006/0048010 A1 | 3/2006 | Tai et al. |
| 2006/0111804 A1 | 5/2006 | Lin |
| 2006/0123380 A1 | 6/2006 | Ikeuchi |
| 2006/0190876 A1 | 8/2006 | Yamada |
| 2006/0282189 A1 | 12/2006 | Akisawa et al. |
| 2007/0055892 A1 | 3/2007 | Pikus |
| 2007/0101305 A1 | 5/2007 | Smith et al. |
| 2007/0201442 A1 | 8/2007 | Hekmatpour et al. |
| 2007/0234246 A1 | 10/2007 | Sinha et al. |
| 2007/0265725 A1 | 11/2007 | Liu et al. |
| 2007/0266356 A1 | 11/2007 | Chang et al. |
| 2007/0266362 A1 | 11/2007 | Lai et al. |
| 2007/0277134 A1 | 11/2007 | Zhang et al. |
| 2007/0288219 A1 | 12/2007 | Zafar et al. |
| 2009/0070725 A1 | 3/2009 | Yamada |
| 2009/0199151 A1 | 8/2009 | Banerjee et al. |
| 2010/0122231 A1 | 5/2010 | Agarwal et al. |

OTHER PUBLICATIONS

Zhou, Ying, et al., "A New Methodology for Interconnect Parasitics Extraction Considering Photo-Lithography effects," 6 pages.

U.S. Appl. No. 12/025,933, filed Feb. 5, 2008 by Francis Ko, Chih-Wei Lai, Kewei Zuo, Henry Lo, Jean Wang, Ping-hsu Chen, Chun-Hsien Lin, and Chen-Hua yu for "Novel Methodology to Realize Automatic Virtual metrology," 23 pages.

Cheng, Y.C., et al., "Patterning Effect and Correlated Electrical Model of Post-OPC MOSFET Devices," Proceeding of SPIE vol. 6521 65210G-1 to 65210G-9, 9 pages.

Ottesen, Craig, "Front Opening Pod (FOUP) Fire Protection: A General Overview," International Sematech, Nov. 5, 1999, 10 pages.

Chen, Kuah-Chou, et al., "Integrated Circuits Industry/Front-Opening Unified Pod Auto-Loading Structure," Knowledge Bridge, No. 22, Apr. 2002, 4 pages.

Chappell, Jeff, "The Future is the FOUP—company Business and Marking," Electronic News, Jul. 17, 2000, 2 pages.

Ouyang, Charles, et al., "An Analytical Model of Multiple ILD thickness Variation induced by Interaction of Layout Pattern and CMP Process," IEEE Transactions on Semiconductor Manufacturing, Aug. 2000, 7 pages.

Raghvendra, Srinivas, et al., "DFM: Linking Design and Manufacturing," Proceedings of the 18th International conference on VLSI Design held jointly with 4th International Conference on Embedded Systems Design, VLSID, 2005, 4 pages.

Tsuijikawa, Hiroyuki, et al., "Power=Supply Noise Reduction with Design for Manufacturability," IEICE Trans Fundamentals, vol. E88-A, No. 12, Dec. 2005, 8 pages.

Yue, H. H., et al., "Fault Detection of Plasma Etchers using Optical Emission Spectra," Aug. 2000, IEEE Transactions on Semiconductor Manufacturing, vol. 13, Issue 3, 12 pages.

Huang, Yi-Ting, et al., "Importance of Data Quality in Virtual metrology," IEEE Industrial Electronics, IECON 2006, 32nd Annual Conference, Nov. 6-10, 2006, 6 pages.

Chang, Yaw-Jen, et al., "Virtual Metrology Technique for Semiconductor Manufacturing," Neural Networks, 2006, IJCNN '06, International Joint conference Jul. 16-21, 2006, 5 pages.

Lin, Tung-Ho, et al., "A Virtual Metrology Scheme for Predicting CVD Thickness in Semiconductor Manufacturing," Robotics and Automation, ICRA Proceedings 2006, IEEE International Conference May 15-19, 2006, 6 pages.

Banerjee, Shayak, et al., "Electrically Driven Optical Proximity Correction," Proc. of SPIE vol. 6925, 69251W-1, (2008), 0277-786X08/ $18-doi: 10.117/12.790786, 9 page.

\* cited by examiner

CUSTOMIZED PATTERNING MODULATION AND OPTIMIZATION

CROSS REFERENCE

The present disclosure is related to the following commonly-assigned U.S. patent application, the entire disclosure of which is incorporated herein by reference: U.S. Ser. No. 12/250,424 filed Oct. 13, 2008 by inventors Yung-Chin HOU, et al. for "TABLE-BASED DFM FOR ACCURATE POST-LAYOUT ANALYSIS" (attorney reference TSMC2008-0074).

BACKGROUND

The integrated circuit (IC) design is more challenging when semiconductor technologies are continually progressing to smaller feature sizes, such as 65 nanometers, 45 nanometers, and below. The performance of a chip design is seriously influenced by the control of resistance/capacitance (RC), timing, leakage, and topology of the metal/dielectric inter-layers. In the semiconductor fabrication, various processing-modules are involved. Each module releases some representative information to design model for the follow-up works. Afterward, a statistical corner is added onto the simulation model for design reference. Such design flow lacks of cross-team interaction, especially when the feature size is dramatically shrunken in upcoming advanced technologies. The existing design method is challenged by various problems. For example, every module in current semiconductor processing modeling, such as lithography patterning, thin film deposition, etching and etc, is independent from other modules. The full chip tape, as the final design product, cannot be achieved without maximized modeling efficiency. In another problem, the statistical corner used for design reference reduces the design flexibility and design margin. Furthermore, in the current IC design flow, the patterns used in the simulation are too simpler than the frequently designed patterns. Therefore, what is needed is a method and a system to provide effective IC design for the advanced IC technologies addressing the above problems.

SUMMARY

The present disclosure provides one embodiment of an integrated circuit (IC) design method. The method includes providing an IC design layout of a circuit; applying an electrical patterning (ePatterning) modification to the IC design layout according to an electrical parameter of the circuit and an optical parameter of IC design layout; and thereafter fabricating a mask according to the IC design layout.

The present disclosure also provides another embodiment of an integrated circuit (IC) design method. The method includes providing an IC design layout of an integrated circuit; providing an ePatterning database associating a geometrical parameter of the IC design layout to both an electrical parameter of the integrated circuit and an optical parameter of the IC design layout; extracting a change to the geometrical parameter from the ePatterning database according to the electrical parameter and the optical parameter; applying the change to the geometrical parameter of the IC design layout; and thereafter making a mask according to the IC design layout.

The present disclosure also provides another embodiment of a method for making an integrated circuit (IC). The method includes providing an IC design layout by an IC designer; adding an assistant feature to the IC design layout according to the IC design layout and an electrical parameter of the integrated circuit, by a semiconductor manufacturer; thereafter making a mask according to the IC design layout by the semiconductor manufacturer; and making a semiconductor wafer using the mask by the semiconductor manufacturer.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a traditional IC process and process control modeling, data are collected and tabularized by each module team. The final modeling is implemented by a design team, such as a SPICE team. Then a statistical corner is provided to the design team for SPICE semi-empirical modeling. Currently, the design technology is progressed to design for manufacturability or design for manufacturing (DFM) methodology, which is an integration of manufacturing data and design procedure for better yield and design efficiency. The interaction and communication between designer and manufacturer is enhanced thereby. DFM can be realized at various design stages with collaboration of design tool vendors. In one example, the manufacturer may be a semiconductor foundry. The designer may be an integrated circuit (IC) design house. The design tool vendor may be an electronic design automation (EDA) tool vendor. However, the design method in DFM methodology involves time consuming transistor level simulation and requires providing more confidential manufacturing information from the manufacturer to the designer. Furthermore, when the product is transferred from one fabrication site to another fabrication site or from one manufacturing technology to another manufacturing technology, the designer has to be involved in manufacturing information communication and designer/manufacturer interaction with extra effort/cost for redesigning.

In the disclosed IC design method, an effective communication among processing modules and the design team is enhanced by various features presented in different embodiments. Those features include but not limited to, an IC design layout can be tuned directly according to device performance. For example, the IC design layout is tuned according to an electrical parameter, such as the threshold voltage of a transistor. The conventional optical proximity correction (OPC) technique is integrated with the above electrical tuning technique such that each modification to the IC design layout is directly targeted for simultaneously enhancing the electrical performance and optimizing the imaging considering the lithography imaging effect including the OPC effect. Therefore, there is no separate OPC step implemented before or after the modification to the IC design layout. In another embodiment, there is no optical simulation applied to the IC design layout for lithography results in the disclosed method. Furthermore, there is no electrical simulation applied to the IC design layout for circuit performance. Instead, an ePatterning table or equation is built and is used for electrical performance with efficiency. The multi-object optimization is achievable according to circuit performance, particularly electrical performance. The manufacturing information is fully utilized and the design is globally optimized for more specific processing recipes, processing models, and mask making technologies. In the disclosed design method, the interaction between the designing and wafer (and photomask as well) manufacturing is achieved at a step to incorporate various dummy features, such as dummy insertions for chemical mechanical polishing (CMP) and optical proximate correction (OPC) features, implemented by the mask making module of the semiconductor manufacturer. Therefore, the manufacturing information is incorporated into the IC design but is still remain inside the manufacturing. The ePatterning is different from CMP dummy insertion or OPC. The CMP dummy insertion is designed for adding dummy features to and modifying the IC design layout to enhance the CMP process. Similarly, the OPC technique is designed for adding assistant features to and modifying the IC design layout to enhance the optical resolution, thus only targeting the optical performance of the lithography process. In contrast, the ePatterning is designed for adding assistant features to and modifying the IC design layout to enhance the electrical performance of the device to be formed and additionally to enhance the lithography optical performance and/or CMP performance, thus achieving multi-object optimization (e.g., optical performance, fabrication performance and electrical performance). During optimizing the electrical performance of a device, various processing deviations introduced from various processing modules are compensated by tuning design layout of the device to achieve the designed electrical performance of the device. For example, the design layout of a gate to a transistor is modified to reduce the electrical performance deviation from various manufacturing processes and optimize the electrical performance of the transistor, therefore providing a bridge and method to effectively communicate among the designing module and various manufacturing modules. The ePatterning method is further described below in detail through various embodiments.

Figure 1:
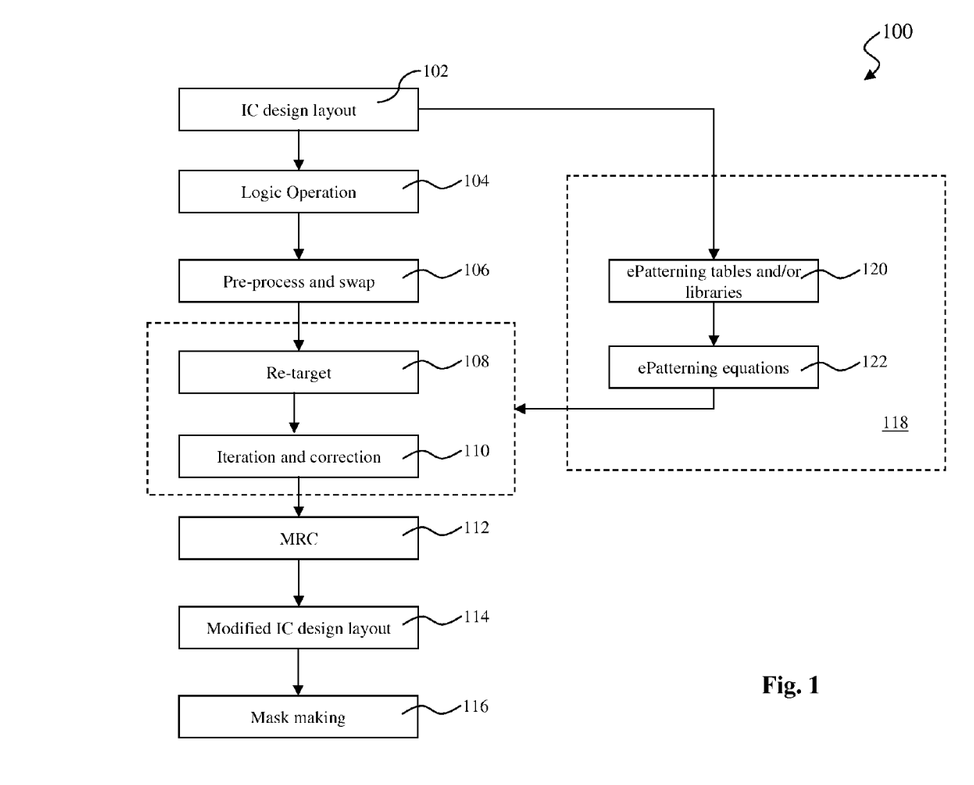
FIG. 1 is a flowchart of an embodiment of an integrated circuit (IC) design method constructed according to aspects of the present disclosure.

FIG. 1 is a flowchart of a method 100 for IC design (or mask making) constructed according to various aspects of the present disclosure in one or more embodiment. The method 100 begins at step 102 by providing an IC design layout from a designer. In one example, the designer can be a design house or a design team separated from a semiconductor manufacturer (or IC fab.) assigned for making IC product according to the IC design layout. In one example, the semiconductor manufacturer is a semiconductor foundry. The IC design layout includes various geometrical patterns designed for an IC product and based on the specification of the IC product. The IC design layout is presented in one or more data file having the information of the geometrical patterns. In one example, the IC design layout is expressed in gds format known in the art. The designer, based on the specification of the product to be manufactured, implement a proper design procedure to form the IC design layout. The design procedure may include logic design, physical design, and/or place and route. In one particular example for illustration, a portion of the IC design layout includes various IC features, such as active region, gate electrode, source and drain, metal lines or via of the interlayer interconnection, and openings for bonding pads, to be formed in a semiconductor substrate (such as a silicon wafer) and various material layers disposed on the semiconductor substrate. The IC design layout is then provided by the designer to the semiconductor manufacturer assigned or contracted for making the IC products according to the IC design layout.

The method 100 may proceed to step 104 by performing a logic operation (or LOP) to the IC design layout. The logic operation modifies the IC design layout according to the manufacturing rules. In this example, the logic operation is performed by the semiconductor manufacturer. Various manufacturer modules convert the manufacturing constrains into a set of rules that the IC design layout has to meet. Otherwise, the IC design layout will be modified accordingly such that the modified IC design layout meets these rules. Such modification is implemented at this step by a logic operation.

The method 100 may proceed to step 106 by performing pre-process and swap process. During the pre-process and swap process at this step, the geometrical patterns in the IC design layout are divided, matched, and replaced for the repetitive blocks such that the IC design layout is simplified for further processing. In one example, a repetitive pattern is replaced such that any further modification to the repetitive pattern will not be duplicated for each repetitive pattern in order to reduce the process cost/time with enhanced efficiency. If a repetitive pattern appears in various design, it can be extracted into a database, or library for future use. In this case, the repetitive pattern is replaced by a standard pattern in the library.

The method proceeds to step 108 by performing a re-targeting process to the IC design layout. In this step, the various assistant features, such as scattering bars and dummy insertion, are added to the IC design layout. However, these additional features are added to the IC design layout targeted for electrical performance of the circuit to be formed on a semiconductor substrate according to the IC design layout. Therefore, these additional features are referred to as e-features or ePatterning features. For clarity, those functional elements in the circuit are referred to as main features. The e-features are different from the assistant features used in the optical proximity correction (OPC) process. The OPC assistant features are sub-resolution features, which have dimensions under the resolution of the lithography process. Thus, those sub-resolution OPC features cannot be imaged on a semiconductor substrate. However, the e-features include at least a subset of features having dimensions to be imaged to a semiconductor substrate. Those features are referred to as resolution features. The e-features may additionally include sub-resolution features. In one embodiment, some e-features are spaced away from the main features. For example, the e-features include dummy isolation features and/or conductive features disposed away from the main features to provide a uniform thermal effect during a thermal process. Those thermal features also provide improved electrical parameter since the electrical parameters, such as the threshold voltage, are tunable by a thermal process. In another embodiment, optical performance (lithography) and/or fabrication performance (e.g. CMP) are additionally and simultaneously improved. In addition to adding various e-features, main features are repositioned, resized, and/or reshaped according to one or more electrical parameters, such as saturation current, leakage current and threshold voltage, such that the final circuit formed on a semiconductor substrate (e.g. wafer) presents improved electrical performance. Additionally, the lithography imaging of the retargeted IC design layout is improved with enhanced resolution and precision. Similarly, the CMP process is also enhanced accordingly. The re-targeting process is not only used to incorporate e-features but also modifying the main features for both electrical performance and optical performance with multi-object optimization. Alternatively, other features may be added or other action may be applied to the IC design layout. For example, dummy insertion features may be added to the IC design layout for enhanced chemical mechanical polishing (CMP) or other processing advantages.

The method 100 proceeds to step 110 by performing an iteration and correction process to the IC design pattern. The process of adding the e-features and modifying the main features can be iterated at this step until the formed IC design layout achieves a high electrical performance of the formed circuit or meet the expected criteria (in term of electrical performance) based on the final pattern to be formed on a semiconductor substrate. In this step, the iteration and correction process may be implemented according to an ePatterning database 118, which will be further explained later.

The method 110 may further proceed to the step 112 by performing a mask rule check (MRC) to the IC design layout. At this step, the IC design layout is further checked by the mask rule and modified accordingly. In one embodiment, the mask rules in the MRC process are extracted from the mask fabrication. In one embodiment, the mask fabrication is a part of the semiconductor manufacturer. Various mask making data are collected from the mask fabrication and extracted into a set of rules that the IC design layout, as the pattern to be imaged to a mask, should follow. In another example, the mask rules or a subset of the mask rules are used as a guideline to tune the IC design layout.

The method 100 then proceeds to step 114 to provide modified IC design layout in a format accessible by a mask making tool, such as an e-bean mask writer. In one embodiment, the modified IC design layout is expressed in a gds format.

The method 100 then proceeds to step 116 for the fabrication of a mask or a group of masks based on the IC design layout. In one embodiment, an e-beam or a mechanism of multiple e-beams is used to form a pattern on a mask (photomask or reticle) based on the IC design layout. The mask can be formed in various technologies. In one embodiment, the mask is formed using the binary technology. In this case, the mask pattern includes opaque regions and transparent regions. The radiation beam (e.g. ultraviolet or UV beam), used to expose the image sensitive material layer (such as photoresist) coated on a wafer, is blocked by the opaque region and transmits through the transparent regions. In one example, the binary mask includes a transparent substrate (e.g., fused quartz), and an opaque material (e.g., chromium) coated in the opaque regions of the mask. In another embodiment, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM known in the art.

Other processing steps may follow after the formation of the mask. In this embodiment, a semiconductor wafer is fabricated using a mask or a set of masks formed by the above method. The semiconductor wafer includes a silicon substrate or other proper substrate and material layers formed thereon. Other proper substrate may alternatively be made of some suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further includes various doped regions, dielectric features, and multilevel interconnects (or formed at subsequent manufacturing steps). In one example, the mask is used in an ion implantation process to form various doped regions in the semiconductor wafer. In another example, the mask is used in an etching process to formed various etching regions in the semiconductor wafer. In another example, the mask is used in a deposition process, such as chemical vapor deposition (CVD) or physical vapor deposition (PVD), to form a thin film in various regions on the semiconductor wafer. Various manufacturing data may be collected from various manufacturing processes including CVD, PVD, etching, ion implantation and lithography process from the previously processed semiconductor wafers, processing tools, and metrology tools.

Furthermore, the method 100 employs the ePatterning database 118 to simplify and improve the IC design layout. The ePatterning database 118 includes ePatterning tables and/or ePatterning libraries 120 for improving IC design applied to the IC design layout and implemented by the method 100, and additionally a mechanism to extract the relevant data from the ePatterning tables or libraries for IC design. In one embodiment, the IC design database 118 additionally includes ePatterning equations 122 to be used for IC design. In the disclosed method, the manufacturing data is used to simulate the wafer processing result (electrical result and optical result) and feed back to the steps 108 for re-targeting and 110 for iteration/correction such that the main features of the IC design layout are resized, repositioned and reshaped and the ePatterning features are added into the IC design layout. Therefore the interaction among the IC designer and various manufacturing modules are effectively implemented inside the semiconductor manufacturer (such as steps 108 and 110). This process is transparent to the IC designer and the IC designer is free of the burden of incorporating the manufacturing information into the IC design layout. Therefore, the method 100 is also referred to as an ePatterning IC design method. Accordingly, the ePatterning tables, libraries, and equations used for this procedure are also referred to as ePatterning tables, libraries, and equations, respectively. The ePatterning tables 120 include tables built up to bridge the IC design layout and wafer processing results (in some cases, mask processing results as well). Instead of directly simulating the lithography process and electrical simulation (collectively referred to as wafer simulation), the wafer simulation result is simplified to a procedure to check the ePatterning tables based on the IC design layout for the corresponding wafer result. In one embodiment, the ePatterning is built by pre-simulating a group of device features with various geometries and dimensions. Thus, the current IC design layout is not simulated for its electrical and optical performance. Its performance is extracted from the ePatterning table. In one particular embodiment, an electrical parameter (such as saturation current) of a transistor is pre-determined through pre-simulation at various sampling points including various dimensions (such as various gate lengths and gate widths). As a particular transistor is concerned, its value of the electrical parameter can be found by the nearest sampling point and changing rate (slope) at that sampling point and the distance between the nearest sampling point and concerned transistor. The optical performance can be collectively optimized in term of the electrical performance. In a particular embodiment, when a transistor, such as complementary metal-oxide-semiconductor (CMOS) transistor, has a particular geometries of the gate electrode and the active region, the corresponding geometries are used as an input to extract its electrical result from the ePatterning table.

The ePatterning libraries are sets of data used to provide the electrical results for a transistor or other main features and can be built similarly as an ePatterning table. The transistor or other main features repetitively appearing in various IC design layout can be preprocessed for its electrical performance and accumulated in the ePatterning library for use. In one embodiment, at the step 102, the IC design layout is processed to extract any representative feature. This representative feature can be found in previous IC design layouts, therefore the electrical results of these features would be simply extracted from the tables and/or libraries. In another situation, if the representative feature will potentially occur in the future IC design layout, the representative feature will also be extracted form the IC design layout and preprocessed for once, saved in the ePatterning tables/libraries, and will be reused in this and other future IC design layout for efficiency. In one example, at step 102, the IC design layout is provided to ePatterning database to extract the representative features and match some features of the IC design layout to the existing representative features in the ePatterning database 118, such as matching to the ePatterning tables/libraries.

In an embodiment of the pre-simulation applied to various sampling points, the optical results (such as the contours of the gate electrode and the active region) of a particular transistor as a sampling point can be obtained by a pre-simulation using the manufacturing data, such as those data from lithography process and/or etching process. During the pre-simulation, the electrical results are determined by simulating a transistor based on the contour of the gate electrode and the active region. In one embodiment regarding the transistor for illustration, the transistor channel is defined as the overlap region between the gate electrode and active region. More particularly, the channel contour is defined as an overlap region between the contours of the gate electrode and the active region. In one embodiment, the channel contour is simulated using a simulation tool for its electrical parameters, such as saturation current, leakage current and threshold voltage. In another embodiment, the channel contour is simplified into an effective geometry, such as an effective rectangle. The simulation is applied to the effective geometry for efficiency. In one example, the contour of the channel is generated from the IC design layout by the simulation and then the effective rectangle is generated from the channel contour based on a procedure aimed to simplify the geometry of that feature (such as the channel) with effectiveness and precision. In a more particular embodiment, such a procedure may implement the method described in the U.S. patent application Ser. No. 12/250,424 filed Oct. 13, 2008 by inventors Yung-Chin HOU, et al. for "TABLE-BASED DFM FOR ACCURATE POST-LAYOUT ANALYSIS". In one example, the effective rectangle is a geometry that can be simulated for the electrical performance effectively and more efficiently by a SPICE tool or other suitable simulation tool. Accordingly, an ePatterning design stage (such as steps 108 and 110) is used in the present disclosure, referring to a design stage in which not only traditional OPC features but also other additional modifications/features are added simultaneously to the IC design layout. As noted above, these modifications/features are collectively referred to as ePatterning features (or e-features). The e-features include modifications/features applied to tunable main features (such as the channel) targeted to tune final electrical performance and simultaneously tune optical performance (lithography patterning) or additionally tune fabrication performance, such as dummy insertion for enhanced CMP process. In other embodiments, the e-features are applied or added to the IC design layout either through model-based and/or rule-based procedure.

As one example for illustration, the generating of the effective rectangle is explained in detail. First, find a maximum rectangle inside the channel contour of the transistor in the IC layout contour defined by the associated gate electrode contour and active region contour. Then, find a width correction to the maximum rectangle according to the difference between the channel contour and the maximum rectangle. Similarly, find a length correction to the maximum rectangle according to the difference between the channel contour and the maximum rectangle. In one embodiment, the equivalent width of the channel is the width of the maximum rectangle plus the width correction, and the equivalent length is the length of the maximum rectangle plus the length correction.

Then the effective geometry to the corresponding feature (e.g. the channel) in the IC design layout is provided to a simulation tool (e.g., SPICE) for the electrical parameters of the transistor for device performance evaluation. One example of the electrical parameters is the saturation current of the transistor. Other examples of the electrical parameters is the leakage current and threshold voltage of the transistor. For better understanding, the simulation applied to the IC design layout to generate the contour based on the manufacturing data is also referred to as a first simulation (or optical simulation). The simulation applied to the contour (or simplified geometry) to generate the electrical parameters is also referred to as a second simulation (or electrical simulation). Thus, the electrical parameters of the transistor are obtained based on the contour of the channel by the electrical simulation, wherein the contour is determined based on the IC design layout and the manufacturing data by the optical simulation.

The e-features added to the IC design layout, as changes made to the IC design layout, are associated with the changes of the electrical parameters through the simulations (the optical simulation and the electrical simulation). Such associations can be used to modify the IC design layout for optimized or improved electrical performance. Furthermore, such associations can be quantitatively expressed in equations, referred to as ePatterning equations 122 and saved in the ePatterning database 118. In one embodiment, each ePatterning equation represents a mathematical relationship between a change to the effective geometry and a change to the one electrical parameter. Thereby, the electrical simulation is eliminated and the electrical parameters can be simply extracted from the ePatterning equations. In one example, changes to certain width and length of the channel in the IC design layout are associated with a change to the certain saturation current of the corresponding transistor. If the saturation current does not meet the specification, it is easy to determine based on the ePatterning equations how much changes are needed to applied to channel of the transistor in the IC design layout to tune the saturation current into the range predefined in the specification. Similarly, the leakage current or threshold voltage can also be expressed in ePatterning equations.

Thus the re-targeting process at step 108 and the iteration/correction at step 110 can be implemented based on the output from the ePatterning database 118. The electrical results of a main feature (such as the channel) can be directly obtained from the ePatterning equations without directly going through the time-consuming simulation. The time for simulation can be avoided to achieve short design time and cost-effectiveness. By these two type of pre-simulations, the electrical parameters of a device (such as a transistor) associated with the IC design layout are built in the ePatterning database. Again, those pre-simulations are implemented in a procedure to build the ePatterning data. When implementing a design to form an integrated circuit, direct simulations are eliminated for efficiency.

The IC design layout is modified and fine-tuned based on the manufacturing data at steps 108 and 110 wherein the ePatterning features are added to the IC design layout. Some advantages and benefits described below may present in various embodiments of the disclosed method for IC designing, furthermore, mask making and wafer fabrication. The designer can focus on the IC design without the burden of considering the manufacturing capability and tuning the IC design according to the manufacturing information. The IC design is modified and fine-tuned according to the manufacturing data at the regular OPC steps by adding the e-features, performed in the semiconductor manufacturing side. Therefore, the manufacturing data are distributed inside of the semiconductor manufacturer and are remain confidential. When an IC product in the semiconductor manufacturer is to be transferred from one product line to a different product line or different manufacturing technology, the designer is not necessarily involved to redesign the existing product according to the new manufacturing information. The semiconductor manufacturer can independently redesign the IC design layout using the disclosed method 100 by modifying or fine-tuning the IC design layout according to the new manufacturing data from the newly assigned product line or semiconductor technology. Accordingly, the new ePatterning database, including the ePatterning tables, libraries, and the equations, is accumulatively built in a preprocessing procedure based on experimental data and production data from the corresponding product line or semiconductor technology. Furthermore, in the method 100, the IC design is tuned not only according to the imaged pattern on the semiconductor wafer but also the electrical parameters or device performance of the final device formed on the semiconductor wafer. Both the optical target (imaged pattern on the wafer by a lithography process) and electrical target (device performance) are accomplished through integrated IC design tuning.

For example, the pattern of the gate electrode (or active region) is tuned using the e-features so that the saturation current is optimized and the leakage current is minimized. In various embodiments, the e-features include assistant features not used only for optical resolution enhancement but also for circuit electrical performance enhancement. Moreover, the e-features also include other modifications to the IC design layout, such as resizing, repositioning and adjusting the border of a feature in the IC design layout. The disclosed ePatterning method, by implementing the modification to the IC design layout, targeting for the optimized performance (or electrical parameters), can effectively coordinate all processing modules in a way that the modified IC design layout reflects the feedbacks of the manufacturing data from all the processing modules, even including the test data from the test module, such as test data from probe test for device electrical performance. Thus, the IC design layout, optical target (for IC patterning) and electrical target (for electrical performance) effectively interact through the e-features in the disclosed method.

Figure 2:
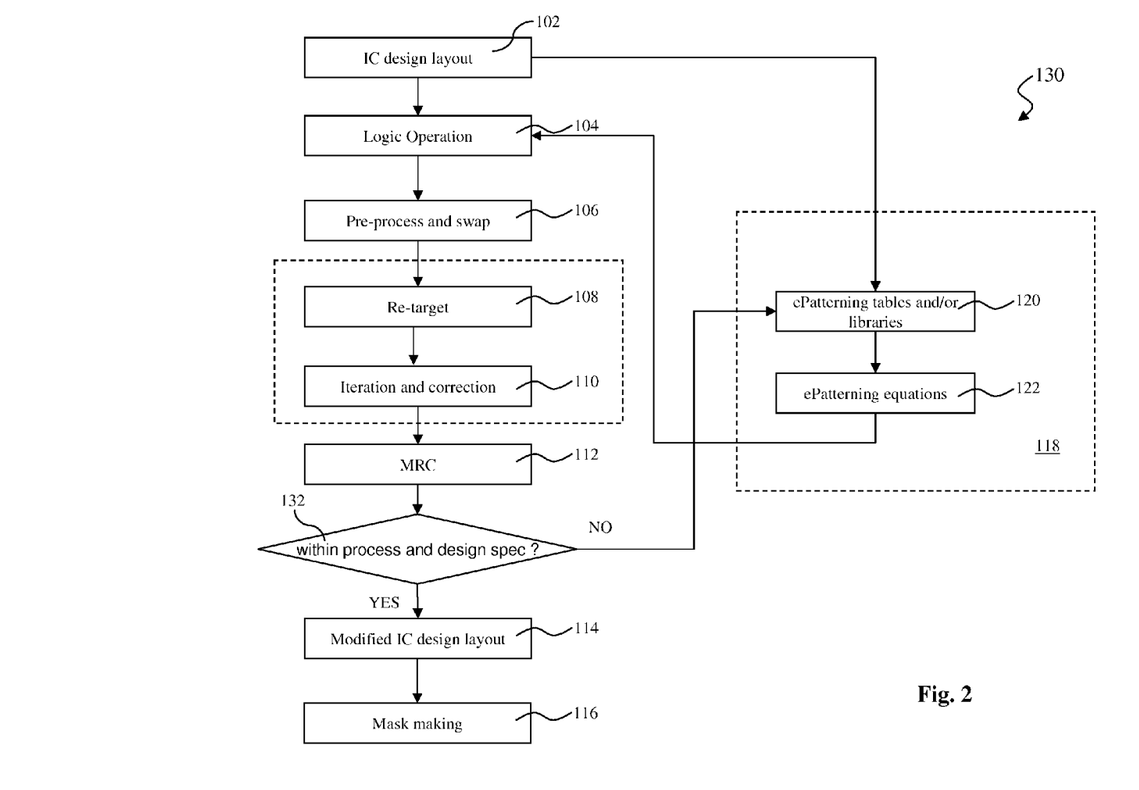
FIG. 2 is a flowchart of another embodiment of an IC design method constructed according to aspects of the present disclosure.

FIG. 2 is a flowchart of an IC design method 130 constructed according to aspects of the present disclosure in another embodiment. Similar steps in FIGS. 1 and 2 are numbered the same for the sake of clarity and simplicity. The method 130 is similar to the method 100 of FIG. 1 and includes an additional step 132 implemented after MRC at step 112. Step 132 is designed to check if the IC design layout is within process specification and design specification. In one embodiment, the process specification is provided by the semiconductor manufacturer. In another embodiment, the design specification is defined according to product specification. If the IC design layout is within the process specification and design specification, the method 130 proceeds to the subsequent step, such as step 114 to provide modified IC design layout in a format accessible by the mask making tool. If the IC design layout is not within the process specification and design specification (out of specifications), the method 130 then proceeds to tune the IC design layout using the ePatterning database 118. The block 118 represents the ePatterning database, such as ePatterning tables/libraries and ePatterning equations, and also represents the action/procedure to tune the IC design layout utilizing the ePatterning database. In furtherance of the embodiment, the method 130 includes a close loop starting from step 132, proceeding to step 118, and then 104 through 112, and then step 132. By implementing the close loop, the IC design layout is tuned through an iterative procedure until the IC design layout converges to the process specification and the design specification.

Figure 3:
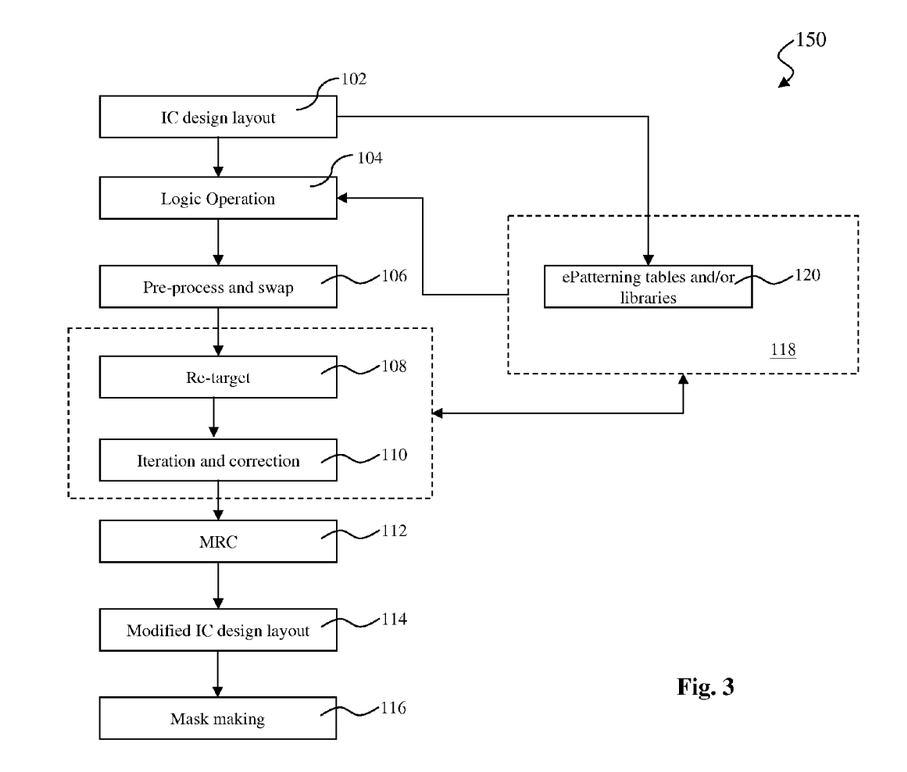
FIG. 3 is a flowchart of another embodiment of an IC design method constructed according to aspects of the present disclosure.

FIG. 3 is a flowchart of an IC design method 150 constructed according to aspects of the present disclosure in another embodiment. Similar steps in FIGS. 1 and 3 are numbered the same for the sake of clarity and simplicity. The ePatterning database 118 used in the method 150 includes the ePatterning tables/libraries 120 but may not include ePatterning equations to achieve the IC design with enhanced interaction and coordination among the designer and various manufacturing modules at the ePatterning stage. In the method 150, the IC design database 118 is used to modify the IC design layout such that the corresponding integrated circuit formed on a wafer by a semiconductor manufacturer has an improved or optimized electrical performance because the IC design layout is tuned specifically to this semiconductor manufacturer. The ePatterning database is built up based on the manufacturing data from this semiconductor manufacturer. The method 150 provides a mechanism to extract data from the ePatterning tables and/or ePatterning libraries 120 and to apply the extracted data to the IC design layout for modification or adding new features. In this method, the manufacturing data from the various processing modules is used to simulate the wafer processing result and optimize the IC design for electrical performance. The interaction and coordination between the IC designer and manufacture modules are implemented at the ePatterning stage inside the manufacturer so that this process is transparent to the IC designer. Various wafer simulation results are represented by the ePatterning tables or libraries. Thus the procedure of modifications and/or adding new features to the IC design layout is simplified to look up the ePatterning tables for libraries. As a result of the method, the designer is freed from the manufacturing details of a particular semiconductor manufacturer. The ePatterning modifications/features can be achieved based on rules (therefore rule-based) or based on models (therefore model-based) or combination thereof. In the rule-based ePatterning, the IC design layout is modified at step 104 by logic operation according to the ePatterning tables/libraries. For example, various rules can be extracted from the manufacturing data and simulations and are saved in the ePatterning database, such as in the ePatterning tables/libraries. The logic operation can apply these rules to modify the IC design layout to improve the electrical performance of the device in the IC design layout.

By implementing the method 100 or the method 150, the ePatterning designing fits in and is integrated with the conventional OPC operation flow but is driven by the electrical performance of the devices to be formed on wafers based on the IC design layout. Besides, as the OPC tool and operation are expensive, the ePatterning design can be implemented in an OPC tool, which is enabled by the disclosed method without direct optical and electrical simulations. By implementing the ePatterning designing in the OPC tool, the design tuning operation is cost-effective and efficient. In another embodiment, the procedure from step 104 to step 110 can be implemented to the IC design layout through more than one cycle until the predefined criteria is met. As an example of the predefined criteria, the leakage current is less than a value defined in the production specification. In one example, the IC design layout is modified at the logic operation step 104 based on the ePatterning tables/libraries and then proceeds to the retargeting at step 108 and iteration/correction at step 110. Thereafter, the IC design layout is verified by predefined criteria if further logic operation and retargeting are needed. If the IC design layout passes the criteria, the method 150 will proceed to the subsequent step such as MRC at step 112. Otherwise, the method 150 will return to step 104 to repeat the processes from step 104 through 110 to further tune the IC design layout until the criteria is met.

Figure 4:
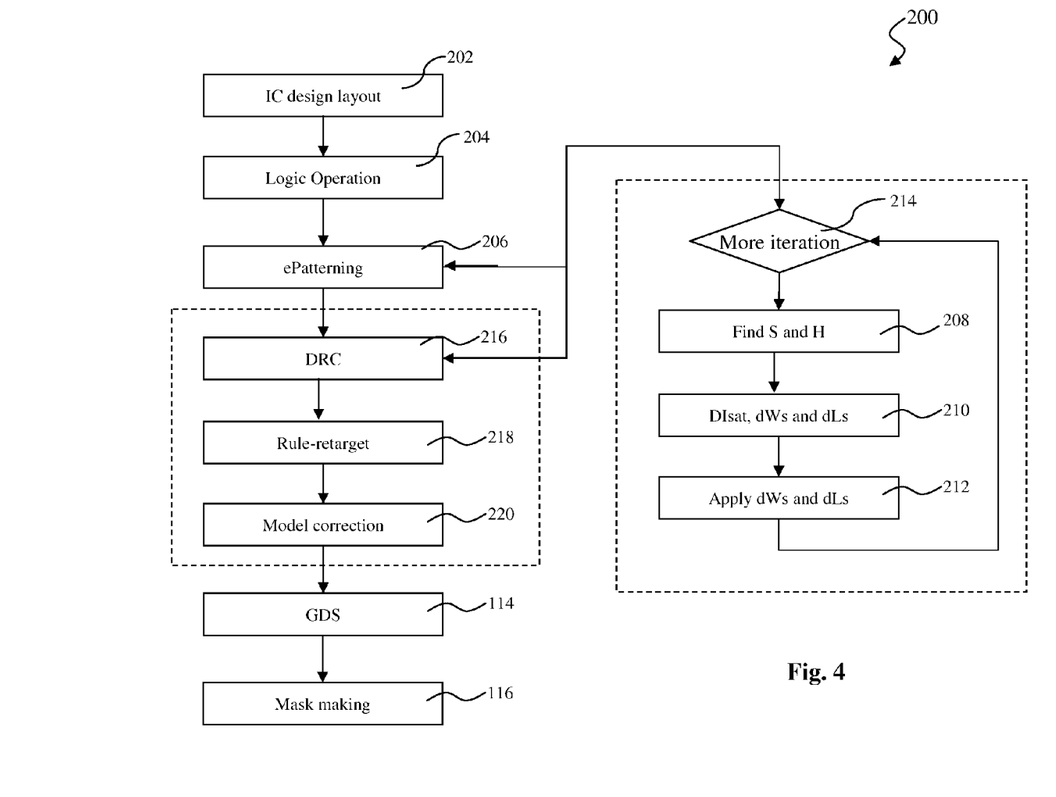
FIG. 4 is a flowchart of another embodiment of an IC design method constructed according to aspects of the present disclosure.

FIG. 4 is a flowchart of a method 200 for IC design constructed according to aspects of the present disclosure in one embodiment. Similar steps in FIGS. 1 and 4 are numbered the same for the sake of clarity and simplicity. The method 200 begins at step 202 by providing an IC design layout (or drawn). In one embodiment, the IC design layout is presented in a gds format.

The method 200 proceeds to step 204 by performing a logic operation (or LOP) to the IC design layout. The logic operation modifies the IC design layout according to the manufacturing rules. In this example, the logic operation is performed by the semiconductor manufacturer. Various manufacturer modules convert the manufacturing constrains into a set of rules that the IC design layout has to meet. If the IC design layout does not meet these constrains, the IC design layout will be modified accordingly. Such modification is implemented at this step by the logic operation.

The method 200 proceeds to step 206 for ePatterning. At step 206, various modifications are applied to the IC design layout based on the manufacturing data from the variety of processing modules in a semiconductor manufacturer assigned to make integrated circuit on semiconductor wafers according to the IC design layout. The processing modules includes, as representative examples, ion plantation, etching, chemical vapor deposition, physical vapor deposition, atomic layer deposition, epitaxy growth, lithography process, and thermal oxidation. The modifications to the IC design layout includes adding new features, resizing, repositioning an existing feature, and changing the border line of an existing feature. As described before, the OPC is designed for adding assistant features to and modifying the IC design layout to enhance the optical resolution. The ePatterning is designed for adding assistant features to and modifying the IC design layout to enhance the electrical performance and the optical performance. The ePatterning incorporates the OPC function such that the ePatterning can add assistant features to and modify the IC design layout to enhance the electrical performance and improve the optical resolution as well.

The ePatterning 206 may be implemented by various substeps and is further described below. In one embodiment, the ePatterning 206 includes step 208 to generate gates. For example, the IC design layout includes one or more transistors, such as metal-oxide-semiconductor (MOS) transistors. Each transistor includes a gate defined on a channel and designed to control the channel. Each gate includes gate dielectric and gate electrode positioned on the gate dielectric. Based on the manufacturing data from the semiconductor manufacturer, a simulation process is applied to the gate to generate a corresponding gate contour. The gate contour, also referred to as ePatterning contour, represents a geometry and dimensions of the gate manufactured by the associated semiconductor manufacturer. Similarly, the contour of the active region is also generated. The channel contour is therefore generated as an overlap region between the contours of the gate and the active region. In one embodiment, the step 208 further includes finding geometrical parameters, such as spacing S and height H. As an example for illustration, the active region includes a first segment perpendicular to the gate and overlapped with the gate. The active region also includes a second segment connected to the first segment, spaced away from the gate, and extended in a direction parallel to the gate. The spacing S represents a spacing between the gate and the second segment of the active region. The height H represents a dimension of the second segment of the active region in the direction parallel to the gate. The gate contour and geometrical parameters can be found by a simulation process.

The ePatterning 206 includes a step 210 to calculate various changes of the electrical parameters and the corresponding changes of the geometrical parameters (or geometrical changes) to the channel in the IC design layout. A geometrical change represents a relative change to the original value of the geometrical parameter of the IC design layout.

Examples of geometrical parameters to the IC device in the IC design layout are length and width of the channel. Thus, the modification to the IC design layout is directly associated with the changes to the electrical performance. The tuning of the IC design layout can be directly targeted for the electrical performance. In one embodiment, a commercial simulation tool SPICE may be used for this purpose. As described above, the channel contour can be simplified to a rectangle, referred to as effective rectangle. Further, the simulation results for various effective rectangles of the channel can be expressed in one or more tables (ePatterning or ePatterning tables) so that these parameters can be determined by looking up the ePatterning tables. In this process, an interpolation procedure may be used to determine the corresponding electrical parameters.

In one embodiment of the step 210, the geometrical changes include dWs and dLs, representing changes to the channel width and length, respectively. The electrical parameters include saturation current Isat. The associated change is saturation current change dIsat. In other embodiments, the electrical parameters include saturation current Isat, leakage current Ioff, threshold voltage Vth, or combinations thereof. Accordingly, the electrical parameter changes includes dIsat, dIoff, dVth, or combinations thereof. The electrical parameters can be considered as constrains applied to the IC design layout. In order for the manufactured device to meet the constrains, the electrical parameters, such as the saturation current Isat, are tuned by changing the geometrical parameters, such as the width W and the length L. The geometrical parameters, electrical parameters, and the relationship therebetween can be determined by a pre-simulation procedure. Thus a change to the geometrical parameter is related to a change to the electrical parameter or changes to more electrical parameters. These associations can be represented in the ePatterning tables and can be extracted from the ePatterning tables. Based on the specification of the device, the necessary changes to the electrical parameters can be achieved by corresponding changes to the geometrical parameters determined from the ePatterning tables.

The ePatterning 206 includes a step 212 to apply these changes dWs and dLs to the channel defined in the IC design layout. The IC design layout is thereby optimized for the electrical performance.

The ePatterning 206 may include a step to check if above described ePatterning patterning needs to be iterated. In one example, an electrical parameter, such as saturation current, is checked to see if it is in a range defined in the production specification. Alternatively or additionally, other electrical parameters, such as leakage current and threshold voltage, are checked to see if those are in the specification ranges. If not, then the steps 208 through 212 are iterated to further tune the IC design layout until the production specification is fulfilled.

The method 200 may proceed to step 216 to apply design rule check (DRC) to the IC design layout. The DRC technique is a rule based modification applied to the IC design layout. In the method 200, design rules can be extracted from the ePatterning 206. For example, the change to the width and length of the channel can be determined by the ePatterning and applied to the IC design layout at DRC step 216. The DRC step 216 in this embodiment performs ePatterning modifications/features integrated in the regular DRC step.

The method 200 may proceed to include steps 218 for re-targeting and 220 for model correction to the IC design layout. The step 218 is implemented to re-target the IC design layout. The re-targeting includes repositioning, reshaping and resizing the main features of the IC design layout.

The step 220 for the model correction is applied to the IC design layout to modify the layout according a model based technique such that the electrical performance and the optical performance are further enhanced. In one embodiment, various ePatterning features are incorporated into the IC design layout for the circuit performance. For example, various dummy features, such as dummy isolation features and/or conductive features, are added to the IC design layout such that a thermal process applied to a semiconductor substrate has a uniform thermal effect during a thermal process.

The method 200 then proceeds to step 114 to provide modified IC design layout in a format accessible by the mask making tool. In one embodiment, the modified IC design layout is expressed in a gds format.

The method 200 then proceeds to step 116 for the fabrication of a mask or a group of masks based on the IC design layout, substantially similar to the step 116 of the method 100 of FIG. 1. The mask can be formed in various technologies. In one embodiment, the mask is formed using the binary technology. In one example, the binary mask includes a transparent substrate (e.g., fused quartz), and an opaque material (e.g., chromium) coated in the opaque regions of the mask. In another embodiment, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM.

Other processing steps may follow after the formation of the mask. In this embodiment, a semiconductor wafer is fabricated using the mask formed by the above method.

Figure 5:
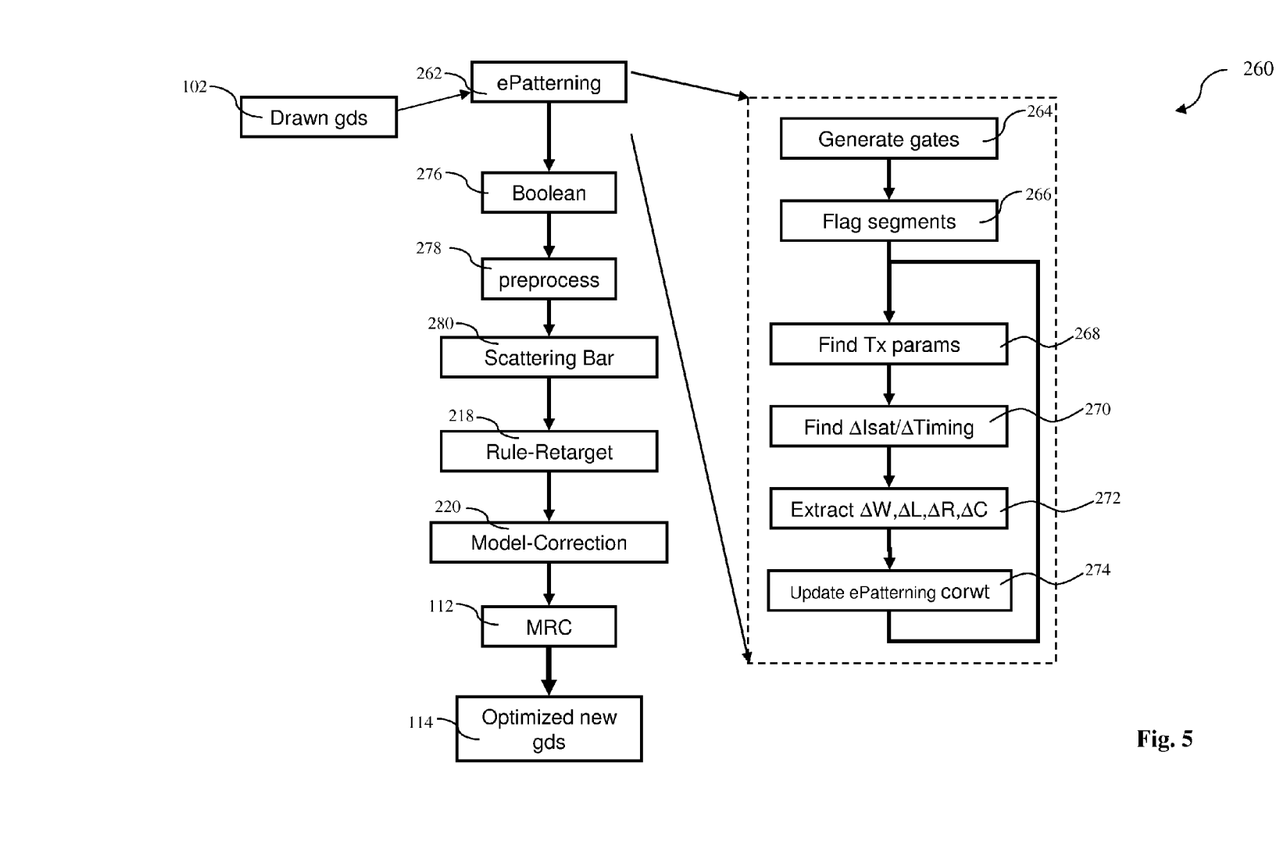
FIG. 5 is a flowchart of another embodiment of an IC design method constructed according to aspects of the present disclosure.

FIG. 5 is a flowchart of a method 260 for IC design constructed according to aspects of the present disclosure in one embodiment. Similar steps in FIGS. 1, 4, and 5 are numbered the same for the sake of clarity and simplicity. The method 260 begins at step 102 by providing an IC design layout (or drawn). In one embodiment, the IC design layout is presented in a gds format.

The method 260 proceeds to step 262 for ePatterning. At step 262, various modifications are applied to the IC design layout based on the manufacturing data from the variety of processing modules in a semiconductor manufacturer used to make integrated circuit on semiconductor wafers. The processing modules includes, as representative examples, ion plantation, etching, chemical vapor deposition, physical vapor deposition, atomic layer deposition, epitaxy growth, lithography process, and thermal oxidation. The modifications to the IC design layout includes adding new features, resizing, repositioning an existing feature, and changing the border line of an existing feature.

The ePatterning 262 includes various sub-steps and is further described below. In one embodiment, the ePatterning 262 includes step 264 to generate gates. For example, the IC design layout includes one or more transistors, such as MOS transistors. Each transistor includes a gate positioned on a channel and designed to control the channel. Each gate includes gate dielectric and gate electrode. Based on the manufacturing data from the semiconductor manufacturer, a simulation process is applied to a gate defined in the IC design layout to generate a corresponding gate contour. The gate contour, also referred to as ePatterning contour, represents a geometry and dimensions of the gate manufactured by the associated semiconductor manufacturer.

Then the ePatterning 262 proceeds to step 266 for flag segments. The gate contour usually is in an arbitrary shape. At the flag segments step, the gate contour is converted to a simpler geometry based on certain rules. In one embodiment, the gate contour is adjusted to a rectangle. In furtherance of the embodiment, the rectangle is adjusted to most close to the gate contour such that the total difference over all border points are minimized with a condition that the area of the rectangle equals the area of the gate contour.

The ePattening 262 may proceed to step 268 by finding relevant testing parameters Tx. For example, the final device formed on a wafer will be measured for an electrical parameter to determine the electrical performance of the device. This electrical parameter can be one of the testing parameters Tx. In one example, the testing parameters includes saturation current Isat, threshold voltage Vts, leakage current Ioff or combinations thereof. The step 268 may include finding most relevant testing parameters to effectively present the device performance. The testing parameters can be found by a simulation process. Based on the simplified gate geometry, such as the rectangle, the transistor is simulated to find out the testing parameters, such as the saturation current. In one embodiment, SPICE simulation tool may be used for this purpose. Further, the simulation results for various rectangle gate can be expressed in one or more ePatterning tables (or ePatterning tables) so that the testing parameters can be found by looking up the ePatterning tables.

The ePattening 262 proceeds to step 270 by finding relative sensitivity parameter, such as ΔIsat/ΔTiming, in which ΔIsat represents a change of the saturation current and ΔTiming represents timing change caused by the gate rectangle. The ΔTiming can also be determined by the simulation or a table built up by the simulation. In one embodiments, the sensitivity parameter is expressed in an ePatterning table.

The ePattening 262 proceeds to step 272 by extracting ΔW, ΔL, ΔR, ΔC from the ePatterning tables. ΔW represents a adjustment to the width of the gate, ΔL represents a change to the length of the gate, ΔR represents a corresponding change of the parasitic resistance, and ΔC represents a corresponding change of the parasitic capacitance.

The ePattening 262 proceeds to step 274 by updating ePatterning weighting factor. Based on the above extracted ΔW, ΔL, ΔR, and ΔC, the IC design layout can be tuned for expected device performance defined in the product specification. For example, when the gate is adjusted by ΔW for its width and ΔL for its length, the relative changes to the parasitic resistance and capacitance can be ΔR and ΔC, respectively. Thus, the gate geometry can be modified with the evaluation of the relative impact to the parasitic resistance and capacitance. In summary, the relative geometrical change to one design feature is associated with the relative change to the testing parameters or other performance parameters. Furthermore, this relationship between the geometry and performance parameters can be predetermined and is saved in an ePatterning table for easy extraction to avoid expensive simulation.

In one embodiment, the steps 268 through 274 may be iterated more than one time. In another embodiment, the steps 268 through 274 may be used to build relationships for other geometrical parameters and the performance parameters and one or more ePatterning tables are used to save the relationships. As another embodiment for illustration, the step 268 is implemented to find various dimensions of the gate and active region including length L, width W, spacing S and height H. The step 270 is implemented to find the relative change of he saturation current dIsat. The step 272 is implemented to calculate relative width change dW and length change dL of the gate corresponding to the dIsat.

The method 260 may proceed to step 276 for Boolean operation similar to the logic operation step 204 of the method 200. The method 260 may then proceed to step 278 to preprocess the IC design layout. During the preprocess, the geometrical patterns in the IC design layout are divided, matched, and replaced for the repetitive blocks such that the IC design layout is simplified for further processing, similar to the preprocess step of the method 100 of FIG. 1. In another example, the IC design layout is defined into a set of various segments each separately modified. Step 280 is proceeded to add scattering bars to the IC design layout or each segment thereof. Then the method 260 proceeds to steps 218 for re-targeting and step 220 for model correction similar to those discussed in the method 200 of FIG. 4. The method 260 proceeds to steps 112 for MRC and 114 for modified (or optimized) IC design layout (expressed in gds format in one example) similar to those discussed in the method 100 of FIG. 1.

Various IC design methods are described in different embodiments using the ePatterning technique. Other embodiments, modification and alternative may present with departure of the spirit of the present disclosure. In one embodiment, the ePatterning technique is implemented in a design system including ePatterning database. In another embodiment, the ePatterning technique is implemented in and integrated with an OPC tool to collectively adding optimize both the electrical and optical performance through a model-based process, rule-based process or combination thereof. The gate or channel of a transistor is a representative example of a sensitive feature that can be modified to tune the electrical parameters. In one embodiment, the ePatterning system includes ePatterning tables. In another embodiment, the ePatterning system includes inline calibration and verification. The ePatterning system may further include a close-loop feedback control for modularized recipe system. In another embodiment, the ePatterning method can be applied to any other device feature to tune its geometrical parameters according to the electrical performance of the whole device or even the electrical performance of the whole integrated circuit. In one example, in addition to applying the ePatterning method to a gate or a channel of the transistor, the ePatterning method is applied to multilayer interconnect (MLI) structure to modify the various geometrical parameters of the metal lines, via and contacts for tuning capacitance/resistance and eliminating mismatch, such as capacitance mismatch. Other advantages may present in various embodiments. The wafer prediction of the IC design layout has higher accuracy for the electrical parameters. The ePatterning table based method is faster and more efficient. The ePatterning method can be easily automated and maintained.

Thus, the present disclosure provides an integrated circuit (IC) design method. The method includes providing an IC design layout of a circuit; applying an electrical patterning (ePatterning) modification to the IC design layout according to an electrical parameter of the circuit and an optical parameter of IC design layout; and thereafter fabricating a mask according to the IC design layout. The present disclosure also provides an integrated circuit (IC) design method in another embodiment. The method includes providing an IC design layout of an integrated circuit; providing an ePatterning database associating a geometrical parameter of the IC design layout to both an electrical parameter of the integrated circuit and an optical parameter of the IC design layout; extracting a change to the geometrical parameter from the ePatterning database according to the electrical parameter and the optical parameter; applying the change to the geometrical parameter of the IC design layout; and thereafter making a mask according to the IC design layout. The present disclosure provides another embodiment of a method for making an integrated circuit (IC). The method includes providing an IC design layout by an IC designer; adding an assistant feature to the IC design layout according to the IC design layout and an electrical parameter of the integrated circuit, by a semiconductor manufacturer; thereafter making a mask according to the IC design layout by the semiconductor manufacturer; and making a semiconductor wafer using the mask by the semiconductor manufacturer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC) design method comprising:
providing an IC design layout of a circuit having a geometrical parameter;
determining an electrical parameter of the integrated circuit based on the geometrical parameter of the IC design layout by accessing an electrical patterning (ePatterning) database and without simulating the IC design layout;
applying an ePatterning modification to the IC design layout, by accessing the ePatterning database, to achieve a target electrical parameter of the integrated circuit and a target optical parameter of the IC design layout, wherein the ePatterning database associates the ePatterning modification with the target electrical parameter; and
thereafter fabricating a mask according to the modified IC design layout.

2. The method of claim 1, further comprising performing a lithography process to a semiconductor wafer using the mask.

3. The method of claim 1, wherein the applying of the ePatterning modification is implemented by a semiconductor manufacturer for fabricating the mask based on the IC design layout.

4. The method of claim 1, wherein the applying of the ePatterning modification comprises adding an assistant feature to the IC design layout to achieve the target electrical parameter.

5. The method of claim 4, wherein applying the ePatterning modification includes adding the assistant feature such that the assistant feature is spaced away from each IC feature of the IC design layout.

6. The method of claim 1, wherein determining the electrical parameter includes determining that the electrical parameter is a parameter selected from the group consisting of a threshold voltage, a leakage current, and a saturation current.

7. The method of claim 1, wherein the applying of the ePatterning modification to the IC design layout includes accessing the ePatterning database to determine a change to the geometrical parameter to apply to the geometrical parameter in order for the integrated circuit to have the target electrical parameter.

8. The method of claim 1, wherein the applying of the ePatterning modification comprises employing an ePatterning equation for relating a modification of the IC design layout to a change to the geometrical parameter in order for the integrated circuit to have the target electrical parameter.

9. The method of claim 1, wherein applying the ePatterning modification to the IC design layout to achieve the target electrical parameter of the integrated circuit includes the target electrical parameter being defined in a production specification.

10. The method of claim 1, wherein applying the ePatterning modification includes applying at least one of adding an assistant feature, repositioning a device feature of the IC design layout, resizing a device feature of the IC design layout, and combinations thereof.

11. The method of claim 1, wherein applying the ePatterning modification to the IC design layout, by accessing the ePatterning database, to achieve a target electrical parameter of the integrated circuit and a target optical parameter of the IC design layout includes applying the ePatterning modification without previously simulating the IC design layout.

12. An integrated circuit (IC) design method comprising:
providing an IC design layout of an integrated circuit having a geometrical pattern;
providing an ePatterning database associating the geometrical parameter of the IC design layout to both an electrical parameter of the integrated circuit and an optical parameter of the IC design layout;
determining an electrical parameter and an optical parameter of the integrated circuit by accessing the ePatterning database and without simulating the IC design layout;
extracting a change to the geometrical parameter from the ePatterning database according to a target electrical parameter of the integrated circuit and a target optical parameter the IC design layout, the ePatterning database associating the change to the geometrical parameter with the target electrical parameter of the integrated circuit;
applying the change to the geometrical parameter of the IC design layout; and
thereafter making a mask according to the changed IC design layout.

13. The method of claim 12, wherein providing the ePatterning database includes providing at least one of an ePatterning table and an ePatterning equation, each relating the change to a variation of the electrical parameter to achieve the target electrical parameter.

14. The method of claim 12, further comprising performing iteration and correlation process to modify the IC design layout to achieve the target electrical parameter.

15. The method of claim 12, wherein the extracting of the change to the geometrical parameter is directly from the ePatterning database and free of optical simulation.

16. The method of claim 12, further comprising forming the ePatterning database based on manufacturing data and an electrical simulation.

17. The method of claim 16, further comprising providing the manufacturing data from various processing modules in a semiconductor manufacturer to be used in the forming of the ePatterning database.

18. The method of claim 12, wherein the providing of the IC design layout is implemented by an IC designer, and the extracting and the applying is implemented by the semiconductor manufacturer.

19. A method for making an integrated circuit (IC), comprising:
providing an IC design layout by an IC designer, the IC design layout having a geometrical parameter;
determining an electrical parameter of the integrated circuit based on the geometrical parameter of the IC design layout by accessing an electrical patterning (ePatterning) database and without simulating the IC design layout;
adding an assistant feature to the IC design layout, by accessing the ePatterning database, in order for the electrical parameter of the integrated circuit to meet a specified electrical range made by a semiconductor manufacturer, wherein the ePatterning database associates the assistant feature with the specified electrical range;
thereafter making a mask according to the IC design layout by the semiconductor manufacturer; and
making a semiconductor wafer using the mask by the semiconductor manufacturer.

20. The method of claim 19, wherein adding the assistant feature comprises disposing the assistant feature away from each of functional features of the integrated circuit.

21. The method of claim 19, wherein adding the assistant feature includes enhancing both the electrical parameter to meet the specified electrical range of the integrated circuit and a specified imaging resolution of the IC design layout.

22. The method of claim 19, wherein adding the assistant feature includes adding a resolution feature.

\* \* \* \* \*